United States Patent
Grupp (10) Patent No.: US 7,615,402 B1
(45) Date of Patent: Nov. 10, 2009

(54) ELECTROSTATICALLY OPERATED TUNNELING TRANSISTOR

(75) Inventor: Daniel E. Grupp, Stockton, NJ (US)

(73) Assignee: Acorn Technologies, Inc., Santa Monica, CA (US)

( * ) Notice: Subject to any disclaimer, the term of this patent is extended or adjusted under 35 U.S.C. 154(b) by 1394 days.

(21) Appl. No.: 09/612,607

(22) Filed: Jul. 7, 2000

(51) Int. Cl.
   *H01L 51/40* (2006.01)
(52) U.S. Cl. ............... 438/99; 438/197; 438/199; 438/686
(58) Field of Classification Search ............ 257/14, 257/32; 438/99, 197, 199, 686
See application file for complete search history.

(56) References Cited

U.S. PATENT DOCUMENTS

| | | | |
|---|---|---|---|
| 4,631,352 A | 12/1986 | Daud et al. | |
| 4,675,711 A | 6/1987 | Harder et al. | |
| 4,751,563 A | 6/1988 | Laibowitz et al. | |
| 4,837,604 A | 6/1989 | Faris | |
| 4,935,804 A | 6/1990 | Ito et al. | |
| 5,019,530 A | 5/1991 | Kleinsasser et al. | |
| 5,258,625 A | 11/1993 | Kamohara et al. | |
| 5,291,274 A | 3/1994 | Tamura | |
| 5,401,980 A | 3/1995 | Fang et al. | |
| 5,422,496 A | 6/1995 | Kamohara et al. | |
| 5,475,341 A | 12/1995 | Reed | |
| 5,589,692 A | 12/1996 | Reed | |
| 5,604,154 A | 2/1997 | Takahashi et al. | |
| 5,608,231 A | 3/1997 | Ugajin et al. | 257/24 |
| 5,612,233 A | 3/1997 | Roesner et al. | |
| 5,646,420 A | 7/1997 | Yamashita | |
| 5,646,559 A | 7/1997 | Higurashi | |
| 5,665,979 A | 9/1997 | Takahashi et al. | |
| 5,677,637 A | 10/1997 | Nakazato et al. | |

(Continued)

FOREIGN PATENT DOCUMENTS

JP     9-331064     12/1997

OTHER PUBLICATIONS

Luryi et al., Resonant tunneling of two-dimensional electrons through a quantum wire:a negative transconductance device, 1985, Appl. Phys. Lett. V47, pp. 1347-1349.*

(Continued)

*Primary Examiner*—Long Pham
(74) *Attorney, Agent, or Firm*—Sonnenschein Nath & Rosenthal LLP (57) ABSTRACT

A transistor operated by changing the electrostatic potential of an island disposed between two tunnel junctions. The transistor has an island of material which has a band gap (e.g. semiconductor material). Source and drain contacts are provided. The transistor has a first tunnel junction barrier disposed between island and source, and a second tunnel junction barrier disposed between island and drain. The island is Ohmically isolated from other parts of the transistor as well as a substrate. A gate electrode is capacitively coupled to the island so that a voltage applied to the gate can change the potential of the island. The transistor has n- and p-type embodiments. In operation, applying a gate voltage lowers (e.g., for positive gate bias) or raises (e.g., for negative gate bias) the conduction band and valence band of the island. When the conduction band or valence band aligns with the Fermi energy of the source and drain, tunneling current can pass between the source, island and drain.

3 Claims, 5 Drawing Sheets

U.S. PATENT DOCUMENTS

| | | | |
|---|---|---|---|
| 5,705,827 | A | 1/1998 | Baba et al. |
| 5,710,051 | A | 1/1998 | Park et al. |
| 5,731,598 | A | 3/1998 | Kado et al. |
| 5,754,077 | A | 5/1998 | Ohata et al. |
| 5,834,793 | A | 11/1998 | Shibata |
| 5,877,511 | A | 3/1999 | Tanamoto et al. |
| 5,972,744 | A | 10/1999 | Morimoto et al. ........... 438/197 |
| 6,339,227 | B1 * | 1/2002 | Ellenbogen .................. 257/40 |

OTHER PUBLICATIONS

L J Geerligs, "Charge Quantisation Effects in Small Tunnel Junctions", *Delft University of Technology*, The Netherlands, pp. 171-204.

P. Hadley, "Single-Electron Tunneling Devices", *TMR Programme Certosa di Pontignano (SI)*, 7/20, Sep. 1997, 1-15.

Harron Ahmed, Kazuo Nakazato, "Single-Electron Devices", *Microelectronic Engineering 32* , (1996), pp. 297-315.

John Randall et al., "Potential Nanoelectronic Integrated Circuit Technologies", *Microelectronic Engineering 32* , (1996) pp. 15-30.

Bogdan Majkusiak, "Experimental and Theoretical Study of the Current-Voltage Characteristics of the MISIM Tunnel Transistor", IEEE Transactions on Electron Devices vol. 45 No. 9 (Sep. 1998) pp. 1903-1911.

C.A. Meed, "Operation of Tunnel-Emission Devices", *Journal of Applied Physics*, Vo. 32, No. 4 (Apr. 1959).

Y. Takahashi et al., "Fabrication Technique for SI Single-Electron Transistor Operating at Room Temperature", *IEEE Electronics Letters Online*, No. 19950063 vol. 31 No. 2 (Jan. 19, 1995), pp. 136-137.

Kazuo Nakazato and Haroon Ahmed, "Enhancement of Coulomb blockade in Semiconductor Tunnel Junctions", *Appl. Phys. Lett.*, (Mar. 21, 1995) pp. 3170-3172.

R. H. Davis and H.H. Hosack, "Double Barrier in Thin-Film Triodes", *Journal of Applied Physics*, vol. 34, No. 4 (Part 1), (Apr. 1963) pp. 864-866.

Kiyonori Kato, "Liquid helium Level Meter by Audio-Sound Detection", *Rev. Sci. Instrum* (60/7), (Jul. 1989) pp. 1343-1345.

E. Tosatti and R. Martonak, "Rotational Melting in Displacive Quantum Paraelectrics", *Solid State Communications*, vol. 92, Nos. 1-2 (1994) pp. 167-180.

Hiroyuki Sakaki, "Quantum Microstructure Devices", *Solid State Communication*, vol. 92, Nos. 1-2, (1994) pp. 119-127.

M. A. Reed et al , "Realization of a Three-Terminal Resonant Tunneling Device: The Bipolar Quantum Resonant Tunneling Transistor" App Phys Lett (11) (Mar. 12, 1989) pp. 1034-1036.

R J Schoelkopk et al , "The RF-SET: A Fast and Ultra-Sensitive Electrometer", Submitted to Science, (Dec. 11, 1997) pp. 1-6.

Federico Capaso et al., "Multiple Negative Transconductance and Differential Conductance in a Bipolar Transistor by Sequential Quenching of Resonant Tunneling" App Phys Lett 53 (12) (Sep. 19, 1988) pp. 1056-1058.

J.L. Huber et al., "An RTD/Transistor Switching Block and its Possible Application in Binary and Ternary Adders", *IEEE Transaction of Electron Devices*, vol. 44 No. 12 (Dec. 1997) pp. 2149-2153.

Robert F. Service, "Microelectronics" "IBM Puts Fast Chips on a New Footing", *Science*, vol. 281, (Aug. 14, 1998) pp. 893-894.

David Berman et al., "Single-Electron Transistor Research", http://nanowed.mit.edu/annual-report/14, (downloaded Oct. 7, 1998), pp. 1-4.

Mikko Paalanen, "Nanophysics-A New Fronitier of Science", http://www.edita.fi/ehdet/polysteekki/297/nanop.html, (downloaded Oct. 7, 1998) pp. 1-5.

Steven P. Beaumont, "III-V Nanoelectornics", *Elsevier Science B.V., Microelectronic Engineering 32*, (1996) pp. 283-295.

P.K. Vasudev and P.M. Zeitzoff, "Si-ULSI with a Scaled-Down Futre", *IEEE Circuits & Devices* (1998), pp. 19-29.

S.J. Wind et al., "Scaling Silicon MOS Device toTheir Limits", *Elsevier Microelectronic Engineering 32*, (1996) pp. 271-282.

Naoki Yokoyama et al., "A New Functional, Resonant-Tunneling Hot Electron Transistor (RHET)", *Japanese, Journel of Applied Physics*, vol. 24 No. 11 (Nov. 1985) pp. I 853-I 854.

Victor Ryzhii et al., "Resonant-Tunneling Bipolar Transistors witha Quantum-Well Base", *Japanese, Journel Applied Physics*, vol. 35 No. 10 (Oct. 1996) pp. 5280-5283.

Serge Luryi and Federico Capasso, "Resonant Tunneling of Two-Diminsional Electrons Through a Quantum Wire: A Negative Transconductance Device" Appl Phys Lett 47 (12) (Dec. 15, 1985) pp. 1347-1349.

J.R. Schreffer, "Symmetry of the Order Parameter in High Temperature Superconductors", *Solid State Communications*, vol. 92, Nos. 1-2 (1994) pp. 129-139.

Federico Capasso and Richard A. Kiehl, "Resonant Tunneling Transistor with Quantum Well Base and High-Energy Injection: A New Negative Differential Resistance Device" J Appl Phys 58 (3) (Aug. 1, 1985) pp. 1366-1367.

Ming C. Wu et al., "Quantum-Switched Heterojunction Bistable Bipolar Transistor by Chemical Beam Epitaxy", *Appl. Phys. Lett.* 57(2) (Jul. 9, 1990) pp. 150-152.

Alan C. Seabaugh et al., "Pseudomorphic Bipolar Quantum Resonant-Tunneling Transistor", *IEEE Transactions on Electron Devices*, vol. 36, No. 10 (Oct. 1989) pp. 2327-2334.

D. Ali and H. Ahmed, "Coulomb Blockade in a Silicon Tunnle Junction Device", *Appl. Phys. Lett.* 64 (16), (Apr. 18, 1994), pp. 2119-2120.

PCT—International Search Report, PCT/US00/10688, Jan. 29, 2001.

* cited by examiner

ELECTROSTATICALLY OPERATED TUNNELING TRANSISTOR

FIELD OF THE INVENTION

This invention relates generally to solid state switching and amplification devices, i.e. transistors. More particularly, it relates to tunneling transistor devices having tunnel junctions.

BACKGROUND

Complementary metal oxide semiconductor (CMOS) devices such as MOSFET transistors are commonly used in high speed, highly integrated circuits. Integrated circuit manufacturers are constantly increasing the operating speed and decreasing the size of MOSFET transistors. Such improvements yield smaller, faster ICs with more functions at lower cost.

Various problems exist with scaling MOSFET devices below 0.1 microns, however. For example, with channel lengths less than 0.1 microns the required channel doping levels become very high. It is difficult to produce high doping levels with high uniformity over the surface of a wafer. Therefore, different MOSFETs manufactured on the same wafer will have very different characteristics if high doping levels are used. Also, capacitive coupling between drain and source regions of individual MOSFETs becomes significant. Problems also exist in mass producing such devices.

For these reasons, researchers have been investigating transistor devices based on the quantum behavior of electrons in very small devices. A number of such devices that exploit electron tunneling are known in the art.

For example, U.S. Pat. No. 5,705,827 to Baba et al. discloses a tunneling transistor device having an insulated gate. The transistor operation is provided by band bending in a current channel adjacent to the gate electrode, as in a MOSFET device. The drain electrode forms an Esaki tunnel junction with the current channel.

U.S. Pat. No. 4,675,711 to Harder et al. discloses a tunneling transistor using an insulated gate electrode disposed adjacent to a tunneling layer. The tunneling layer has a band gap energy different from that of semiconductor source and drain contacts. A voltage applied to the gate changes an energy barrier height of the tunneling layer, thereby controlling a tunnel current through the tunnel layer. The device must be operated at low temperature so that thermally excited carriers do not provide conduction through the tunnel layer.

U.S. Pat. No. 5,834,793 to Shibata discloses a tunneling MOSFET transistor device having an insulated gate contact. Adjacent to the gate contact is a short current channel. Source and drain contacts are separated from the current channel by dielectric tunnel barriers about 30 Angstroms thick. The device exhibits negative resistance characteristics due to discrete energy states in the current channel.

U.S. Pat. No. 5,291,274 to Tamura discloses a tunneling transistor. The transistor of Tamura has a middle layer high dielectric constant material disposed between two tunnel junctions. The middle layer is in direct contact with a gate electrode. Source and drain electrodes are provided in contact with the tunnel junctions. When a voltage is applied to the gate electrode, the electrical potential of the middle layer is changed, thereby allowing electrons to tunnel between source and drain. A problem with the device of Tamura is that current will flow to and from the gate electrode when the device is on. Therefore, the device of Tamura requires continuous gate current for continuous operation. This is highly undesirable in many applications.

In addition to the above, others have investigated the uses of single electron transistors having tunneling junctions. A single electron transistor has a very small metallic or semiconductor island disposed between two tunnel junctions having a high resistance. Source and drain contacts are made to the tunnel junctions. A gate electrode capacitively coupled to the island provides switching control. The island is made sufficiently small such that an energy required to charge the island with a single electron is greater than the thermal energy available to electrons in the source and drain contacts. The energy required to charge the island with a single electron is given by $E_C = e^2/2C$, where e is the charge of an electron, and C is the capacitance of the island. This energy requirement for charging the island is termed the Coulomb blockade.

In operation, a voltage applied to the gate electrode capacitively raises or lowers the potential of the island. When the island potential is lowered by a certain amount, electrons can tunnel through one tunnel junction onto the island, and tunnel through the other tunnel junction off of the island. In this way, current is allowed to flow through the island for certain values of gate voltage. The resistance of a single electron transistor exhibits oscillations as gate voltage changes monotonically.

Available thermal energy increases with temperature, of course, so a single electron transistor has a maximum temperature at which it can be operated. The maximum operating temperature is determined by the capacitance of the island, which is a function of the island size. For devices to operate at room temperature, the capacitance C must be less than about 10 Attofarads. Realizing such low capacitance requires that the island be very small (e.g., less than 10 nm on a side) and located relatively far from the source, drain and gate. It is very difficult to make a single electron transistor which operates at room temperature.

An important concern in the design of a single electron transistor is the resistance of the tunnel junctions. It is best for a single electron transistor to have tunnel junctions with relatively high resistances (i.e., much greater than a quantum resistance $R_q = h/2e^2 \approx 26$ KOhms, where h is Planck's constant). If the resistance of the tunnel junctions is too low, then the number of electrons on the island is not well defined. Operation of a single electron transistor requires that the tunnel junctions have sufficiently high resistances such that electron locations are well defined as being either in the island or outside the island. However, high tunnel junction resistance results in a high resistance between source and drain contacts, even in a fully 'ON' state. A high resistance limits the switching speed and increases the power consumption of the device. Therefore, single electron transistors are limited in their electrical characteristics and potential applications.

A distinguishing characteristic of single electron transistor devices is that the island can be made of semiconductor material or metal. The island does not need to be made of material having an electron energy band gap.

SUMMARY OF THE INVENTION

Disclosed herein is a transistor that includes a pair of tunnel junctions (or barriers), each having a resistance less than or equal to approximately a quantum resistance. The tunnel junctions are separated from one another by an island formed of a material having a non-uniform density of energy states (e.g., at least one region that contains available energy states adjacent to at least one region that does not contain any available energy states). The tunnel junctions are each disposed between a respective one of a pair of conductors (e.g., source and drain conductors) and the island, and a gate electrode is capacitively coupled to the island.

In some cases, the island may be formed of a semiconductor material, for example, silicon, germanium or any other semiconductor. In other cases, a superconductor may be used. The tunnel barriers may be formed of an oxide of the material from which the conductors (and/or the gate electrode) or the island is/are made or may be formed from a different material all together. In operation, a conduction path between the tunnel junctions may be formed by shifting the energy states of the island through the application of a potential to gate electrode. A current may then be passed through the conduction path via the source and drain electrodes.

In one embodiment, an apparatus for switching electrical current has an ohmically isolated island made of material (e.g., a semiconductor material such as silicon, gemanium, etc.) having a band gap. The island is sufficiently large such that electron energy levels within the island are preferably separated by less than 100 meV. The apparatus also has a source contact and a first tunnel junction barrier located between the source contact and the island. The first tunnel junction barrier has a thickness and cross sectional area selected such that a first tunnel junction formed by the interconnection of the source contact, the first tunnel junction barrier and the island has a resistance less than a quantum resistance, i.e., less than 26 KOhms. The apparatus also has a drain contact and a second tunnel junction barrier located between the drain contact and the island. The second tunnel junction barrier has a thickness and cross sectional area selected such that a second tunnel junction formed by the interconnection of the drain contact, the second tunnel junction barrier and the island also has a resistance less than the quantum resistance. The apparatus also has a gate electrode capacitively coupled to the island.

In some cases, the first and second tunnel junctions may have resistances less than 10 KOhms. Further, in other embodiments the first and second tunnel junctions may have resistances less than 1 KOhm or even less than 100 Ohms.

The first and second tunnel junction barriers may be made of an insulating material, such as silicon dioxide or aluminum oxide, and may be separated by a distance of approximately 0.2-2.0 microns.

Preferably, the apparatus includes an insulating layer disposed between the gate electrode and the island.

BRIEF DESCRIPTION OF THE DRAWINGS

The present transistor is illustrated by way of example, and not limitation, in the accompanying drawings, in which.

DETAILED DESCRIPTION

A switching device employing low resistance tunnel junctions is disclosed herein.

More specifically, a transistor-like device having a pair of tunnel junctions, each with a resistance less than or equal to approximately the quantum resistance ($R_q \approx h/2e^2$), and being separated by an island formed of a material having a non-uniform density of energy states is proposed. The use of low resistance tunnel junctions is in contrast to the approach used in single electron transistors and the like. In essence, by eschewing the Coulomb blockade approach, the present circuit is able to operate at room temperatures without the severe size restrictions imposed on Coulomb blockade devices. Furthermore, the present circuit differs from resonant tunneling transistors (RTTs) and similar devices, which rely on quantum wells to set the energy scale of the device for its operation. Although the present device is discussed with reference to certain illustrated embodiments thereof, upon review of this specification those of ordinary skill in the art will recognize that the present circuit may be constructed in a number of ways and may find application in a variety of systems. Therefore, in the following description the illustrated embodiments should be regarded as exemplary only and should not be deemed to be limiting in scope.

More precisely, the present transistor includes an island made of material having a band gap. The island is preferably sufficiently large such that electron energy states thereinare separated by less than 100 meV (i.e., energy states in the valence or conduction band, not the band gap). Therefore, at room temperature, the valence and conduction bands of the island behave as continuous energy bands. The island may be regarded as a region that is not connected by Ohmic conduction paths to any other region of the transistor. Metallic leads may be used for source and drain electrodes, and a gate electrode may be capacitively coupled to the island. The tunnel junctions may be formed at the interconnections of tunnel junction barriers disposed between the island and the source and drain electrodes and these tunnel junction barriers may be formed of an insulating material. As indicated above, the tunnel junctions have a resistance less than a quantum resistance, e.g., less than 26 KOhms. This is possible because the present transistor does not rely on a Coulomb blockade to achieve switching behavior.

Figure 1:
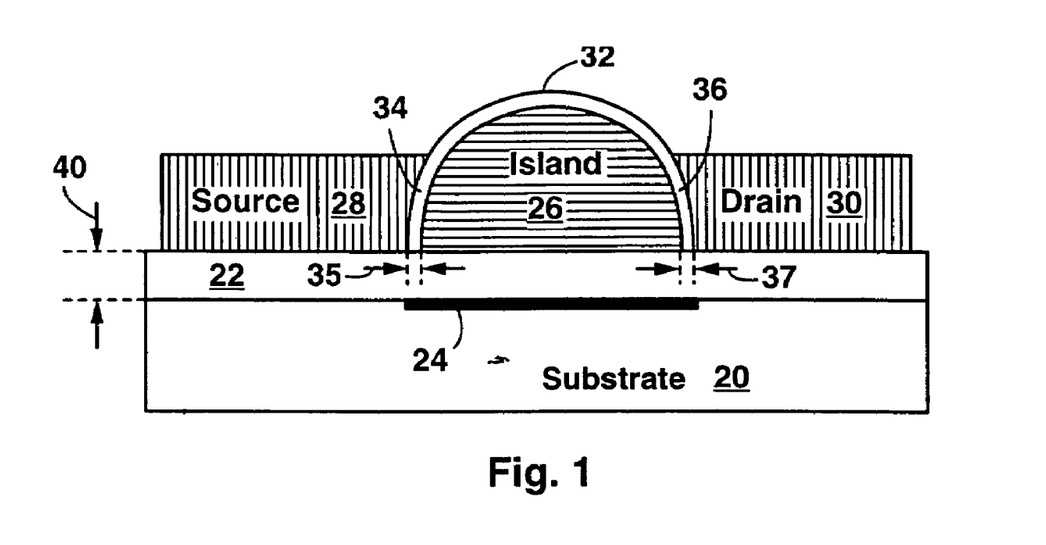
FIG. 1 shows a transistor structure according to an embodiment of the present invention.

FIG. 1 shows one embodiment of the present transistor. An insulating layer 22 (e.g., $SiO_2$) of thickness 40 is disposed on a substrate 20. The substrate may be made of an appropriate semiconductor material, silicon, for example. Thus, layer 22 may be grown by wet or dry oxidation as is common in the semiconductor processing arts. A gate electrode 24 is located between the substrate 20 and layer 22.

An island 26 is located on top of the layer 22 and is aligned opposite the gate 24, so that the gate and the island are capacitively coupled. The island can have a wide range of doping levels, including no doping at all. A source contact 28 and a drain contact 30 are provide at opposite sides of the island 26, and a thin, insulating film 32 forms a first tunnel junction 34 between the source 28 and the island 26. Film 32 also forms a second tunnel junction 36 between the drain 30 and island 26. First tunnel junction 34 (i.e., the film 32 at the point of the first tunnel junction) has thickness 35, and second tunnel junction 36 (i.e., the film 32 at the point of the second tunnel junction) has thickness 37. Thicknesses 35, 37 are determined by the thickness of film 32. Note, the film 32 may be formed from a material of which island 26 is made (e.g., an oxide thereof), of which source and drain contacts 28 and 30 are made (e.g., an oxide thereof) or of a different material all together.

The source contact 28 and drain contact 30 are preferably made of a metal such as aluminum, copper, gold, titanium or the like. Source and drain contacts made of metal are preferred because metals have higher carrier mobilities. Therefore, metal source and drain contacts provide superior high frequency performance and switching and low power characteristics (e.g., over contacts formed of other materials, such as semiconductors).

It is noted that the apparatus of FIG. 1 is symmetrical; that is, source 28 and drain 30 are interchangeable and tunnel junctions 34 and 36 are also interchangeable. Most embodiments of the present transistor are symmetrical. However, in some embodiments of the present transistor, first and second junctions 34 and 36 are not identical, and, therefore, in these embodiments the apparatus is not symmetrical.

Film 32 is preferably very thin so that tunnel junctions 34 and 36 have relatively low resistances. For example, film 32 may be 1-40 Angstroms thick. Film 32 may be formed by a chemical vapor deposition (CVD) process, or by oxidizing the island material, for example. Of course, other manufacturing processes may be used, depending on the material of which film 32 is made. In the figure, film 32 is shown to cover the entire island 26, however, in other embodiments film 32 may cover the island only in regions close to the tunnel junctions 34 and 36.

Island 26 is made of a material having a band gap, such as silicon, germanium or any other semiconductor material. Island 26 can also be made of superconductor materials, which have a band gap when cooled below a critical temperature. Island 26 is not made of metal. Preferably, island 26 is made of doped (or undoped) semiconductor material. Thus, embodiments of present transistor include p-type and n-type devices having p- and n-doped semiconductor islands.

Tunnel junctions 34 and 36 each have a resistance less than the quantum resistance (e.g., approximately 26 KOhms). The resistance of the first tunnel junction 34 is determined by the thickness 35, and a surface area of contact (i.e., the junction area) of film 32 between the source 28 and island 26. The resistance of the second tunnel junction 36 is determined by the thickness 37, and a surface area of contact of film 32 between the drain 30 and island 26. The resistance of the tunnel junctions 34, 36 scales linearly with junction area (lower resistance for larger junction area), and exponentially with thickness (lower resistance for thinner junctions). The tables below provide exemplary (and approximate) thicknesses and junction areas for tunnel junctions having different resistances:

| Junction Area | Film Thickness |
|---|---|
| For 26 K-Ohm Tunnel Junctions | |
| 50 nm × 50 nm | 12 Angstroms |
| 100 nm × 100 nm | 18 Angstroms |
| 200 nm × 200 nm | 24 Angstroms |

| Junction Area | Film Thickness |
|---|---|
| -continued | |
| For 13 K-Ohm Tunnel Junctions | |
| 50 nm × 50 nm | 9 Angstroms |
| 100 nm × 100 nm | 15 Angstroms |
| 200 nm × 200 nm | 21 Angstroms |
| For 2.6 K-Ohm Tunnel Junctions | |
| 50 nm × 50 nm | 2 Angstroms |
| 100 nm × 100 nm | 8 Angstroms |
| 200 nm × 200 nm | 14 Angstroms |

More preferably, the tunnel junctions 34 and 36 each have a resistance less than 10 KOhms, and most preferably less than 1000 Ohms. These resistance values are achieved by appropriately selecting the thickness and junction area of film 32 in the area of the tunnel junctions 34 and 36. It will be apparent to one of ordinary skill in the art that many different combinations of junction thickness and junction area provide junction resistance less than the quantum resistance.

Gate 24 is capacitively coupled to island 26 through layer 22. Thickness 40 is thick enough so that a resistance between gate 24 and island 26 is very high, such that it essentially draws no current. For example, this resistance may be on the order of $10^8$ Ohms or greater, more preferably, on the order of $10^{10}$-$10^{12}$ Ohms, or greater. Because gate 24 and island 26 are only capacitively coupled, essentially no tunnel current or Ohmic current can flow between the gate 24 and island 26.

Figure 2:
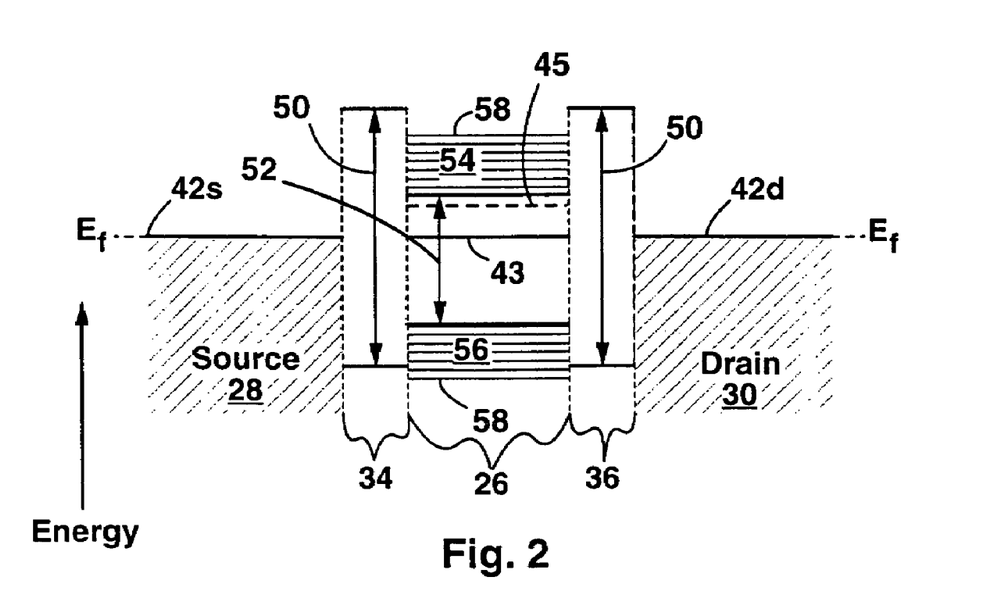
FIG. 2 shows an energy band diagram of the device illustrated in FIG. 1, in a particular embodiment where the island is n-doped.

FIG. 2 shows a schematic band diagram for an n-type device with no voltages applied to the source 28, drain 30 or gate 24. In this embodiment the island 26 is made of n-doped semiconductor material. Source 28 and drain 30 are metals and so have well defined Fermi energies 42s and 42d, respectively. Island 26 has a Fermi energy 43. Island 26 has bandgap 52, which is on the order of 0.5-3 electron volts, for example. Tunnel junctions 34 and 36 (i.e., the tunnel junction barriers disposed between the source/drain and the island) are made of an insulating material and so have large band gaps 50 compared to island 26. Also shown is an island conduction band 54, and an island valence band 56. Since island 26 is made of n-doped semiconductor material, valence band 56 is completely full, and conduction band 54 is partially full. Also, island Fermi energy 43 is relatively close to conduction band 54, and donor levels 45 are present just below the conduction band edge.

Conduction band 54 and valence band 56 have many electron energy levels 58 indicated by horizontal lines. As is known in the art, a spacing between the energy levels 58 is dependent upon the size of the island 26 and the material comprising the island. In the present transistor, the island 26 is designed so that the energy levels 58 are separated in energy by less than about 100 meV, more preferably, less than 50 meV and most preferably less than 25 meV. This is preferred in the present transistor because it assures that, at room temperature, the valence and conduction bands behave as approximately continuous bands. This is because at room temperature (i.e., where T is approximately 300K) $K_bT$~25 meV, where $K_b$ is Boltzmann's constant. In other words, if the energy levels 58 are spaced apart by less than 25-100 meV, electrons at room temperature have enough thermal energy to travel between energy levels 58.

Figure 3:
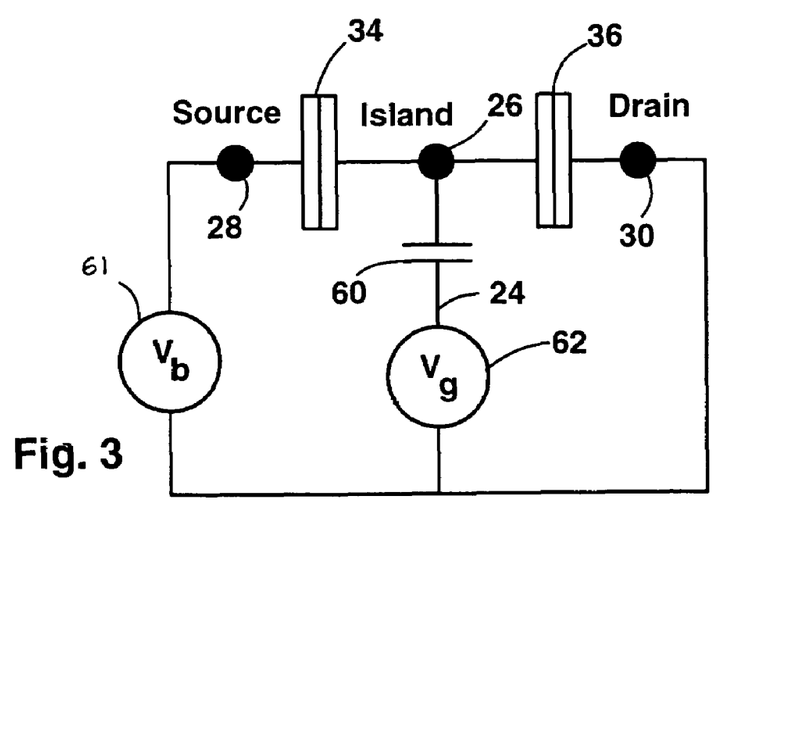
FIG. 3 illustrates a circuit for using the device shown in FIG. 1.

FIG. 3 shows an electrical schematic illustrating how (in one embodiment) the present transistor is used in an electrical circuit. Source 28, drain 30, island 26, and tunnel junctions 34, 36 are indicated. Capacitor 60 represents capacitance between gate 24 and island 26. A bias voltage supply $V_b$ 61 provides a voltage between source 28 and drain 30. The bias supply can provide voltage of both polarities to the source and drain. A gate voltage supply $V_g$ 62 provides voltage between gate 24 and drain. Gate voltage supply 62 can provide both positive and negative voltage to gate 24 with respect to drain 30.

Figure 4:
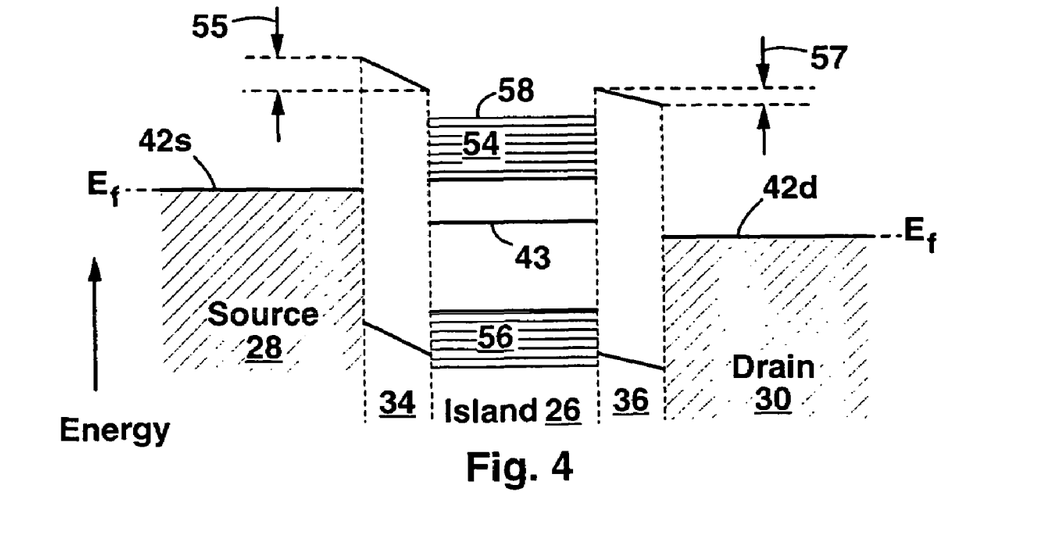
FIG. 4 shows the energy band diagram of the device illustrated in FIG. 2 with a potential applied between source and drain, and zero potential applied between gate and drain.

FIG. 4 shows a band diagram of an n-type device while the bias supply 61 applies a small negative voltage to the source 28 with respect to the drain 30. Gate voltage $V_g$ is zero (i.e., gate 24 and drain 30 are at the same voltage). Voltage 55 across first tunnel junction 34 is not equal to voltage 57 across second tunnel junction 36 due in part to different junction capacitances. More generally, relative voltages across the tunnel junctions 34 and 36 depend upon the relative capacitances between source 28, island 26, drain 30 and gate 24. Also, the different voltages across tunnel junctions 34 and 36 are due to the fact that gate 24 is at the same voltage as drain 30.

Current does not tunnel between source 28 and drain 30 because the bottom edge of conduction band 54 is higher in energy than the source Fermi energy. Therefore, electrons at the source Fermi energy 42s cannot tunnel to energy levels 58 in the conduction band 54. Also, electrons in the valence band 56 cannot tunnel to energy levels at the drain Fermi energy 42d.

Figure 5:
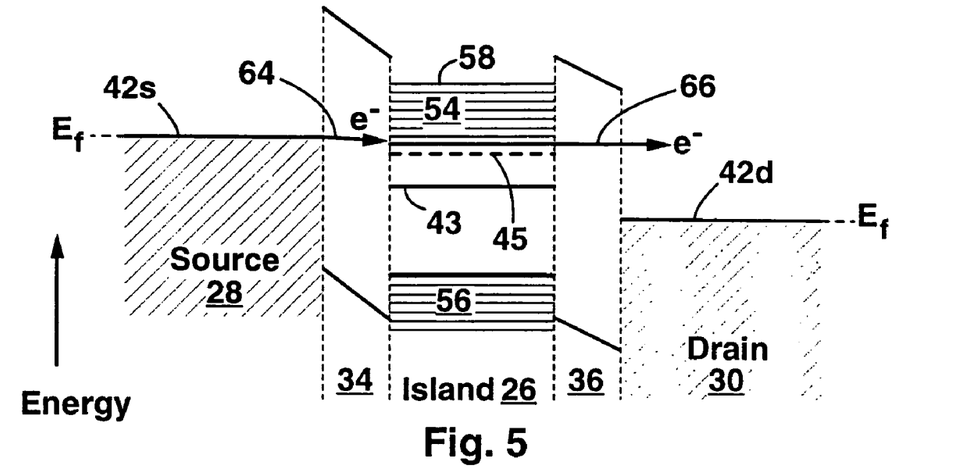
FIG. 5 shows the energy band diagram of the device of FIG. 2 with a potential applied between source and drain sufficient for conduction.

FIG. 5 shows a band diagram of the device while the bias supply 58 applies a bias voltage just sufficient to cause conduction. Again, gate voltage $V_g$ is zero. The bias voltage applied in FIG. 5 is greater than the bias voltage applied in FIG. 4. The bias voltage necessary for conduction (with no gate voltage applied) is the voltage which causes the source Fermi energy 42s to align with the conduction band 54/or donor levels 45. Electrons at the Fermi energy $E_f$ in the source 28 tunnel 64 to the conduction band 54, and then tunnel 66 from the conduction band to the drain. The electrons arrive in the drain as hot electrons above the drain Fermi energy 42d. Again, voltages across tunnel junctions 34 and 36 are shown as unequal, possibly due to differences in relative capacitances, as well as the fact that gate 24 and drain 30 are at the same voltage. It is noted that voltages across junctions 34 and 36 can be equal or unequal in the present transistor.

Figure 6:
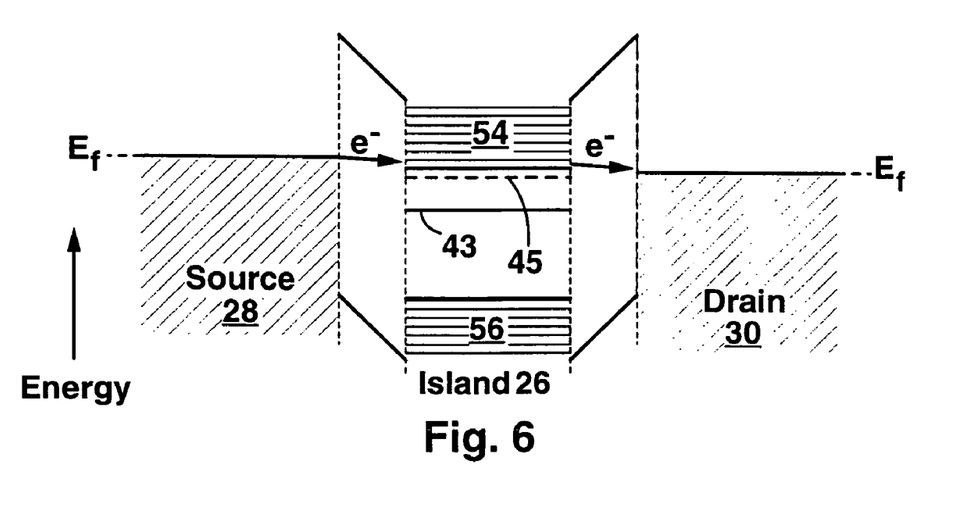
FIG. 6 shows the energy band diagram of the device of FIG. 2 with a positive potential applied to the gate with respect to the drain.

FIG. 6 shows a bandgap diagram of the n-type device with a positive voltage applied to the gate 24 with respect to drain 30. The conduction band 54 is lowered in energy so that it aligns with the source and drain Fermi energies 42s and 42d. Therefore, when a small negative voltage is applied to source 28 with respect to drain 30, electrons can tunnel from source 28, to island 26, to drain 30. Alternatively, a negative voltage applied to drain 30 will cause electrons to tunnel from drain 30, to island 26, to source 28. Therefore, a sufficiently positive bias applied to gate 24 with respect to the drain 30 allows the device to conduct current in both directions.

To summarize, in the case where the island 26 is made of n-doped semiconductor material, application of a positive gate voltage $V_g$ reduces the bias voltage $V_b$ necessary to allow conduction. Conversely, for n-doped devices, a negative gate voltage $V_g$ increases the bias voltage $V_b$ necessary to cause conduction.

Figure 7:
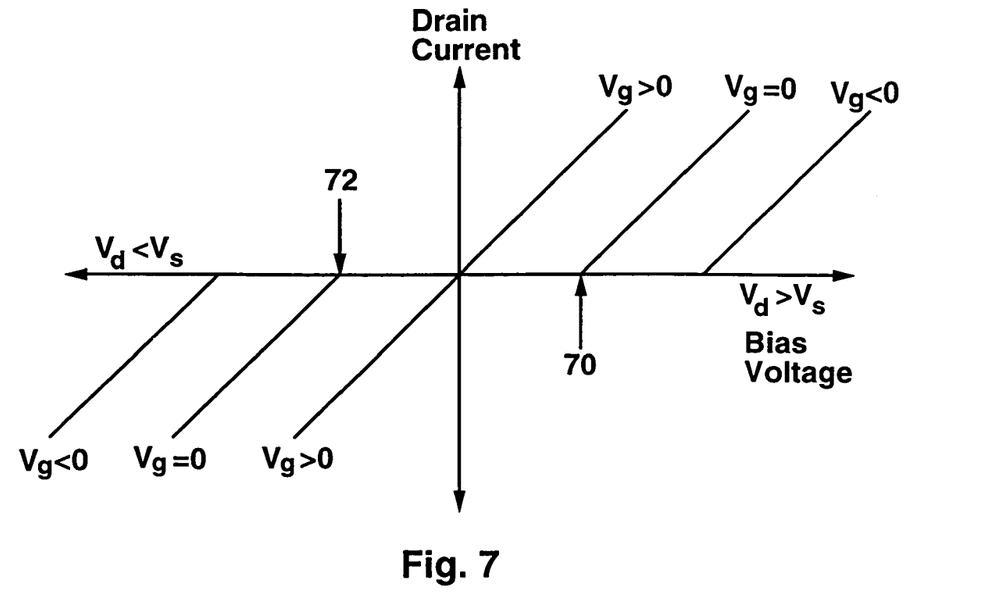
FIG. 7 shows a set of I-V (current-voltage) curves for an n-type device configured in accordance with the present invention.

FIG. 7 shows a plot of bias voltage (i.e., voltage between source 28 and drain 30) versus drain current for different values of gate voltage $V_g$. The plot of FIG. 7 is for a device with an n-doped semiconductor island 26. $V_d$ represents drain voltage, and $V_s$ represents source voltage. A threshold bias voltage 70 is the bias voltage for which the source Fermi energy 42s is aligned with the bottom edge of the conduction band 54. The energy band diagram of FIG. 5 corresponds approximately to the threshold 70.

A complementary threshold bias voltage 72 represents the bias voltage for cases where a negative voltage is applied to drain. The threshold bias 70 and complementary threshold bias 72 do not necessarily have the same voltage magnitude. Thresholds 70 and 72 are defined for zero gate voltage.

It is noted that the threshold bias voltages 70 and 72 depend in part upon the band gap 52 of the island 26. If the band gap energy 52 is high (e.g., 4-5 electron volts), then the threshold bias voltages 70 and 72 will be relatively high. If the band gap energy is low (e.g. 0.2-1.5 electron volts), then the threshold bias voltages 70 and 72 will be relatively low.

Also, threshold bias voltages 70 and 72 depend upon the doping level of the island 26. If the island is highly doped, then threshold bias voltages will be relatively low; if the island is lightly doped, then threshold bias voltages will be relatively high.

The threshold bias voltages 70 and 72 also depend upon the relative capacitances of tunnel junctions 34 and 36. Consider, for example, a case when source 28 is negative with respect to drain 30 and first tunnel junction 34 has a relative low capacitance. A voltage applied between source 28 and drain 30 will mostly be across the first tunnel junction 34. Therefore, only a relatively low voltage is required to align source Fermi energy 42s and conduction band 56. That is, threshold voltage 70 will be relatively low. Complementary threshold voltage 72 will be relatively high. Most generally, differences between the first and second tunnel junction characteristics result in differences in threshold bias voltage 70 and complementary threshold bias voltage 72.

Figure 8:
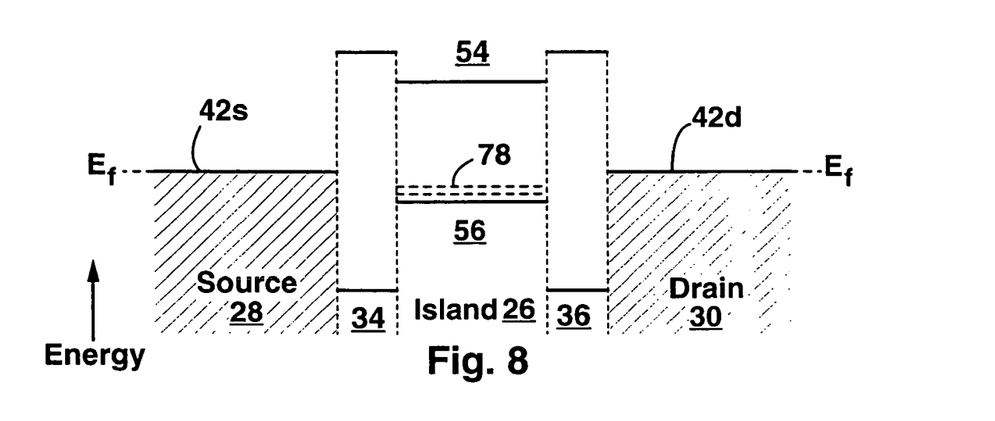
FIG. 8 shows an embodiment of the present transistor in which the island is p-doped, i.e., a p-type device.

FIG. 8 shows an embodiment of the present transistor in which the island is p-doped, i.e., a 'p-type' device. The conduction band 54 and valence band 56 are shifted up in energy compared to the device of FIG. 2, which has an n-doped island 26. The p-doped island 26 in FIG. 8 has acceptor states 78 slightly above the valence band edge. The p-type device will conduct between source 28 and drain 30 when the valence band 56 is aligned with the source Fermi energy 42s or drain Fermi energy 42d.

Figure 9:
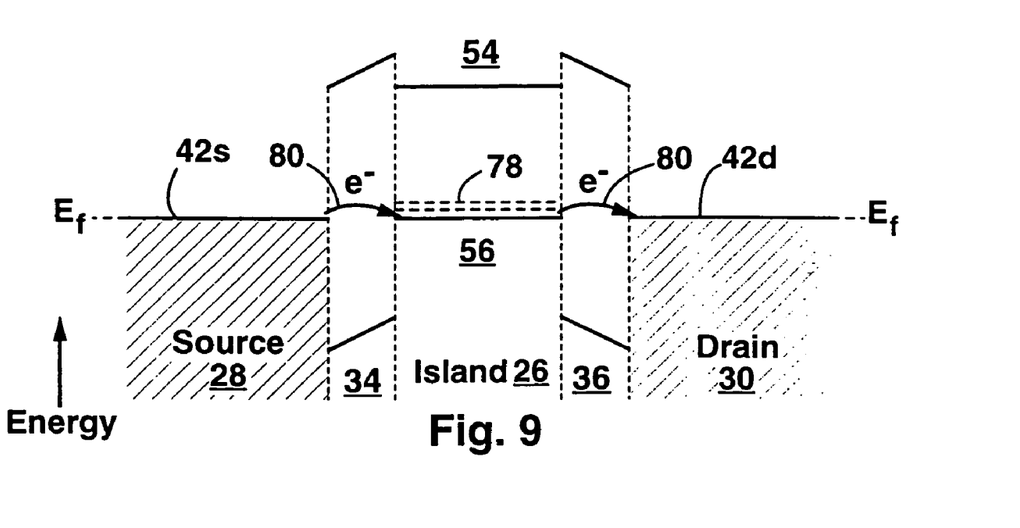
FIG. 9 shows an energy band diagram for p-type device configured in accordance with the present invention with a negative gate voltage applied.

FIG. 9 shows a p-type device with a negative gate voltage applied. The valence band 56 and acceptor states 78 are raised in energy and aligned with the source Fermi energy 42s and drain Fermi energy 42d. When a negative voltage is applied to the source 28 with respect to drain 30, electrons tunnel 80 between the source 28, island 26 and drain 30. Alternatively, a negative voltage is applied to drain 30 with respect to source 28. Of course, it should be remembered that island 26 may be undoped.

It will be clear to one of ordinary skill in the art that the above embodiments may be altered in many ways without departing from the broader scope of the present invention. Accordingly, the scope of the invention should be determined by the following claims and their legal equivalents.

What is claimed is:

1. A method, comprising forming a conduction path between a pair of tunnel junctions each having a resistance less than or equal to approximately a quantum resistance by shifting energy states of an island formed of a material having a non-uniform density of energy states characterized by separated conduction and valence bands that behave as continuous energy bands, the island being disposed between the tunnel junctions.

2. The method of claim 1 wherein the energy states of the island are shifted by application or removal of a voltage through an electrode capacitively coupled to the island.

3. The method of claim 2 further comprising passing a current through the conduction path via electrodes coupled to the tunnel junctions.

* * * * *